United States Patent
Göth et al.

(10) Patent No.: US 12,170,518 B2
(45) Date of Patent: Dec. 17, 2024

(54) ETHERNET FAIL-SAFE RELAY

(71) Applicant: SCHNEIDER ELECTRIC BUILDINGS AMERICAS, INC., Carrollton, TX (US)

(72) Inventors: Eskil Carl Fredrik Göth, Lund (SE); Bror Mats Karlsson, Malmö (SE)

(73) Assignee: SCHNEIDER ELECTRIC BUILDINGS AMERICAS, INC., Carrollton, TX (US)

( * ) Notice: Subject to any disclaimer, the term of this patent is extended or adjusted under 35 U.S.C. 154(b) by 321 days.

(21) Appl. No.: 17/659,345

(22) Filed: Apr. 15, 2022

(65) Prior Publication Data
US 2023/0216491 A1    Jul. 6, 2023

Related U.S. Application Data

(60) Provisional application No. 63/266,288, filed on Dec. 31, 2021.

(51) Int. Cl.
*H03K 17/687* (2006.01)
*H04L 49/40* (2022.01)

(52) U.S. Cl.
CPC ......... *H03K 17/6871* (2013.01); *H04L 49/40* (2013.01)

(58) Field of Classification Search
CPC ........... H03K 17/6871; H03K 17/6874; H03K 17/693; H03K 17/24; H03K 2017/6875; H04L 49/40; H04L 2012/4026; H04L 12/40169; H04L 12/10; H04L 49/351; H04L 49/10; G06F 1/3209; G06F 1/3278; G06F 1/3287
See application file for complete search history.

(56) References Cited

U.S. PATENT DOCUMENTS

| | | | |
|---|---|---|---|
| 2006/0268684 A1* | 11/2006 | Cohn | H04L 12/40045 370/216 |
| 2007/0025240 A1* | 2/2007 | Snide | H04L 12/40169 370/217 |
| 2016/0313776 A1 | 10/2016 | Robitaille et al. | |

FOREIGN PATENT DOCUMENTS

| | | |
|---|---|---|
| EP | 0133760 A2 | 3/1985 |
| EP | 2309678 A1 | 4/2011 |
| WO | 2006124916 A2 | 11/2006 |
| WO | 2007016253 A1 | 2/2007 |
| WO | 2014087379 A1 | 6/2014 |

OTHER PUBLICATIONS

Extended European Search Report from corresponding European Application No. 22217298.3 dated May 30, 2023.

* cited by examiner

*Primary Examiner* — Metasebia T Retebo
(74) *Attorney, Agent, or Firm* — Lando & Anastasi, LLP (57) ABSTRACT

Passive Ethernet by-pass switches, methods of using the same, and systems including the passive Ethernet by-pass switches include a first connection configured to be coupled to a first Ethernet port, a second connection configured to be coupled to a second Ethernet port, and switching circuitry including at least one internal switch operable to allow network communication between the first connection, the second connection, and at least one Ethernet controller, the at least one internal switch including a depletion mode transistor operable to bridge the first connection to the second connection to establish communication between the first connection and the second connection.

23 Claims, 9 Drawing Sheets

ETHERNET FAIL-SAFE RELAY

CROSS-REFERENCE TO RELATED APPLICATIONS

This application claims priority under 35 U.S.C. § 119(e) to U.S. Provisional Application Ser. No. 63/266,288, titled "ETHERNET FAIL-SAFE RELAY," filed on Dec. 31, 2021, which is hereby incorporated by reference in its entirety.

BACKGROUND OF INVENTION

1. Field of Invention

Embodiments of the present invention relate generally to Ethernet port switches, and in particular, Ethernet port by-pass switches including transistors.

2. Discussion of Related Art

Many electrical devices include electrical switching devices, or "switches." Switches can be used to select between different inputs or outputs in a circuit. For example, Ethernet switches are more advanced electrical switches that may include one or more Ethernet ports and one or more internal switches. With the internal switches, data can be routed from one Ethernet port to another.

SUMMARY

At least one aspect of the present disclosure is directed to a passive Ethernet by-pass switch comprising a first connection configured to be coupled to a first Ethernet port, a second connection configured to be coupled to a second Ethernet port, and switching circuitry including at least one internal switch operable to allow network communication between the first connection, the second connection, and at least one Ethernet controller, the at least one internal switch including a depletion mode transistor operable to bridge the first connection to the second connection to establish communication between the first connection and the second connection.

In one example, the second connection is configured to be connected to the second Ethernet port via a jumper. In another example, the passive Ethernet by-pass switch further comprises a third connection configured to be connected to the second Ethernet port. In one example, the at least one internal switch further includes a second internal switch operable to couple the first connection to the at least one Ethernet controller, and a third internal switch operable to couple the second connection to the at least one Ethernet controller. In another example, the second internal switch and the third internal switch each include an enhancement mode transistor.

In one example, the passive Ethernet by-pass switch is implemented as a single integrated circuit chip. Certain examples include the single integrated circuit chip being an application-specific integrated circuit (ASIC) chip.

In another example, the depletion mode transistor of the at least one internal switch includes a first depletion mode transistor and a second depletion mode transistor, the first depletion mode transistor including a source connection and a gate connection, the second depletion mode transistor including a source connection and a gate connection, the source connection of the first depletion mode transistor coupled to the source connection of the second depletion mode transistor, and the gate connection of the first depletion mode transistor coupled to the gate connection of the second depletion mode transistor.

In another example, the depletion mode transistor of the at least one internal switch includes a first depletion mode transistor and a second depletion mode transistor, the first depletion mode transistor includes a drain connection, the second depletion mode transistor includes a drain connection, the gate connection of the first depletion mode transistor is controlled by a first voltage source, the gate connection of the second depletion mode transistor is controlled by a second voltage source, and the drain connection of the first depletion mode transistor is coupled to the drain connection of the second depletion mode transistor.

In one example, the passive Ethernet by-pass switch further comprises a watchdog circuit configured to receive a heartbeat signal from the at least one Ethernet controller or a microcontroller coupled to the at least one Ethernet controller and to provide a signal indicative of a presence or an absence of the heartbeat signal, and a power monitoring circuit coupled to the switching circuitry and the watchdog circuit, the power monitoring circuit configured to operate the Ethernet by-pass switch to cease providing power to the depletion mode transistor. In another example, the watchdog circuit is further configured to provide the signal indicating the presence of the heartbeat signal responsive to receiving the heartbeat signal within a predetermined period of time or within a predetermined number of cycles. In one example, the power monitoring circuit is configured to operate the Ethernet by-pass switch to cease providing power to the depletion mode transistor responsive to receiving the signal provided by the watchdog circuit indicating the absence of the heartbeat signal. In another example, the passive Ethernet by-pass switch includes an AND logic circuit, the logic circuit receiving the signal from the watchdog circuit at a first input, receiving an output of the power monitoring circuit at a second input, and providing a control signal to the depletion mode transistor from an output of the logic circuit.

In one example, the at least one internal switch further includes a second internal switch operable to couple the first connection to the at least one Ethernet controller. In another example, the second internal switch includes an enhancement mode transistor operable to couple the first connection to the at least one Ethernet controller. In one example, the at least one internal switch further includes a third internal switch operable to couple the second connection to the at least one Ethernet controller. In another example, the third internal switch includes an enhancement mode transistor operable to couple the second connection to the at least one Ethernet controller. In one example, the second internal switch and the third internal switch are operable to open responsive to a loss of power.

In another example, the depletion mode transistor is operable to bridge the first connection to the second connection during a loss of power.

At least one aspect of the present disclosure is directed to a passive Ethernet by-pass switch comprising a first connection configured to be coupled to a first Ethernet port, a second connection configured to be coupled to a second Ethernet port, and at least one internal switch including a depletion mode transistor operable to bridge the first connection to the second connection to establish communication between the first connection and the second connection.

At least one aspect of the present disclosure is directed to a system comprising a first Ethernet port, a second Ethernet port, at least one Ethernet controller, and at least one passive Ethernet by-pass switch comprising a first connection configured to be coupled to the first Ethernet port, a second connection configured to be coupled to the second Ethernet port, and switching circuitry including at least one internal switch operable to allow network communication between the first connection, the second connection, and the at least one Ethernet controller, the at least one internal switch including a depletion mode transistor operable to bridge the first connection to the second connection establish communication between the first connection and the second connection.

In one example, the system further comprises a jumper configured to connect the second connection to the second Ethernet port.

In another example, the system further comprises a first network device, a second network device, and a third network device, the second network device including the at least one passive Ethernet by-pass switch and configured to allow network communication between the first network device and the third network device responsive to the depletion mode transistor bridging the first connection to the second connection to maintain communication between the first connection and the second connection.

In one example, the at least one Ethernet controller is configured to generate a heartbeat signal, and the at least one passive Ethernet by-pass switch further comprises a watchdog circuit configured to receive the heartbeat signal from the at least one Ethernet controller or a microcontroller coupled to the at least one Ethernet controller and to provide a signal indicative of a presence or an absence of the heartbeat signal, and a power monitoring circuit coupled to the switching circuitry and the watchdog circuit, the power monitoring circuit configured to operate the Ethernet by-pass switch to cease providing power to the depletion mode transistor. In another example, the at least one Ethernet controller is further configured to generate the heartbeat symbol at least once within a predetermined period of time or at least once within a predetermined number of cycles, and the watchdog circuit is further configured to provide the signal indicating the presence of the heartbeat signal responsive to receiving the heartbeat signal within the predetermined period of time or within the predetermined number of cycles. In one example, the power monitoring circuit is configured to operate the Ethernet by-pass switch to cease providing power to the depletion mode transistor responsive to receiving the signal provided by the watchdog circuit indicating the absence of the heartbeat signal. In another example, the passive Ethernet by-pass switch includes an AND logic circuit, the logic circuit receiving the signal from the watchdog circuit at a first input, receiving an output of the power monitoring circuit at a second input, and providing a control signal to the depletion mode transistor from an output of the logic circuit.

In another example, the depletion mode transistor is operable to bridge the first connection to the second connection during a loss of power.

At least one aspect of the present disclosure is directed to a method for bridging a node using a passive Ethernet by-pass switch, the passive Ethernet by-pass switch including a first connection, a second connection, and switching circuitry including at least one internal switch, the at least one internal switch including a depletion mode transistor, the method comprising coupling the first connection to a first Ethernet port, coupling the second connection to a second Ethernet port, operating the at least one internal switch of the switching circuitry to allow network communication between the first connection, the second connection, and at least one Ethernet controller, and bridging the first connection to the second connection via the depletion mode transistor to establish communication between the first connection and the second connection.

In one example, the passive Ethernet by-pass switch includes a third connection, and the method comprises connecting the third connection to the second Ethernet port.

In another example, the at least one internal switch includes a second internal switch and a third internal switch, and the method comprises operating the second internal switch to couple the first connection to the at least one Ethernet controller, and operating the third internal switch to couple the second connection to the at least one Ethernet controller. In some examples, the second internal switch and the third internal switch each include an enhancement mode transistor.

In one example, the method comprises implementing the passive Ethernet by-pass switch as a single integrated circuit chip. The single integrated circuit chip is, in at least one example, an application-specific integrated circuit (ASIC) chip.

In another example, the depletion mode transistor of the at least one internal switch includes a first depletion mode transistor and a second depletion mode transistor, the first depletion mode transistor includes a source connection and a gate connection, the second depletion mode transistor includes a source connection and a gate connection, and the method comprises coupling the source connection of the first depletion mode transistor to the source connection of the second depletion mode transistor, and coupling the gate connection of the first depletion mode transistor coupled to the gate connection of the second depletion mode transistor.

In one example, the depletion mode transistor of the at least one internal switch includes a first depletion mode transistor and a second depletion mode transistor, the first depletion mode transistor includes a drain connection, the second depletion mode transistor includes a drain connection, and the method comprises controlling the gate connection of the first depletion mode transistor by a first voltage source, controlling the gate connection of the second depletion mode transistor by a second voltage source, and coupling the drain connection of the first depletion mode transistor to the drain connection of the second depletion mode transistor.

In another example, the passive Ethernet by-pass switch includes a watchdog circuit and a power monitoring circuit coupled to the switching circuitry and the watchdog circuit, and the method comprises the watchdog circuit receiving a heartbeat signal from the at least one Ethernet controller or a microcontroller coupled to the at least one Ethernet controller to provide a signal indicative of a presence or an absence of the heartbeat signal, and the power monitoring circuit operating the Ethernet by-pass switch to cease providing power to the depletion mode transistor. In certain examples, the method comprises the watchdog circuit providing the signal indicating the presence of the heartbeat signal responsive to receiving the heartbeat signal within a predetermined period of time or within a predetermined number of cycles.

In one example, the at least one internal switch includes a second internal switch and the method comprises operating the second internal switch to couple the first connection to the at least one Ethernet controller. In another example, the second internal switch includes an enhancement mode transistor and the method comprises operating the enhancement mode transistor of the second internal switch to couple the first connection to the at least one Ethernet controller. In one example, the at least one internal switch includes a third internal switch, and the method comprises operating the third internal switch to couple the second connection to the at least one Ethernet controller. In another example, the third internal switch includes an enhancement mode transistor and the method comprises operating the enhancement mode transistor to couple the second connection to the at least one Ethernet controller. In one example, the method comprises operating the second internal switch and the third internal switch to open responsive to a loss of power.

In another example, the method comprises operating the depletion mode transistor to bridge the first connection to the second connection during a loss of power.

BRIEF DESCRIPTION OF DRAWINGS

Various aspects of at least one embodiment are discussed below with reference to the accompanying figures, which are not intended to be drawn to scale. The figures are included to provide illustration and a further understanding of the various aspects and embodiments, and are incorporated in and constitute a part of this specification, but are not intended as a definition of the limits of the invention. In the figures, each identical or nearly identical component that is illustrated in various figures is represented by a like numeral. For purposes of clarity, not every component may be labeled in every figure. In the figures.

DETAILED DESCRIPTION

Examples of the methods, devices, and systems discussed herein are not limited in application to the details of construction and the arrangement of components set forth in the following description or illustrated in the accompanying drawings.

As used herein, an "active" switch differs from a "passive" switch in that the switching operation requires power to be implemented in the active case and does not require power in the passive case. As used throughout this disclosure, for at least certain embodiments, the term "passive switch" or "passive Ethernet by-pass switch" or the like includes devices having passive components as well as active components.

The methods, devices, and systems are capable of implementation in other embodiments and of being practiced or of being carried out in various ways. Examples of specific implementations are provided herein for illustrative purposes only and are not intended to be limiting. In particular, acts, components, elements and features discussed in connection with any one or more examples are not intended to be excluded from a similar role in any other examples.

Also, the phraseology and terminology used herein is for the purpose of description and should not be regarded as limiting. Any references to examples, embodiments, components, elements or acts of the systems and methods herein referred to in the singular may also embrace embodiments including a plurality, and any references in plural to any embodiment, component, element or act herein may also embrace embodiments including only a singularity. References in the singular or plural form are not intended to limit the presently disclosed systems or methods, their components, acts, or elements. The use herein of "including," "comprising," "having," "containing," "involving," and variations thereof is meant to encompass the items listed thereafter and equivalents thereof as well as additional items.

References to "or" may be construed as inclusive so that any terms described using "or" may indicate any of a single, more than one, and all of the described terms. In addition, in the event of inconsistent usages of terms between this document and documents incorporated herein by reference, the term usage in the incorporated features is supplementary to that of this document; for irreconcilable differences, the term usage in this document controls.

As discussed above, certain electrical devices can include one or more switches that can be configured to route data or network traffic from one Ethernet port to another Ethernet port. In some configurations, ring topologies of network nodes have been used to connect an Ethernet switch to a plurality of network devices connected in a "daisy chain" fashion such that each network device is connected to a node along the ring/daisy chain topology. These daisy chain configurations can require a separate cable (e.g., a "homerun" cable) connecting the network device farthest along the daisy chain back to a managed Ethernet switch that is connected to the first network device. (i.e., in a ring topology). One problem with this configuration can be that if any of the nodes fail, the nodes connected after the failed node must communicate with the managed switch via the separate homerun cable, which can slow transfer speeds. If two nodes fail, any node between the two nodes in the ring topology will not be able to communicate with any other device in the network.

In other network configurations, a failed Ethernet node is bridged by closing a mechanical relay coupled between two ports. However, such relays are generally slow in operation, can fail, and further require power to function.

An Ethernet by-pass switch is described herein that can alleviate the requirements of a managed Ethernet switch and/or a separate homerun cable as described above, thereby improving network communication in the event of node failure. Embodiments provided herein can function with a single failing unit in a node as well as a plurality of failing units across a plurality of nodes. Additionally, the Ethernet by-pass switch described herein is passive in that it does not require power to bridge the connection between Ethernet ports in the event of node failure.

Examples described herein include a solid-state Ethernet fail-safe relay that connects two Ethernet ports together in case of node failure with no need for a battery or other power source. In case of a local failure the internal solid-state relay will automatically bridge the failing node. Depletion mode transistors are used to enable this function without the need for power to bridge the failing node. This fail-safe function makes it possible for a networked system to continue operating even if one local node stops operating correctly. Powering down and servicing of a network node can be performed without affecting the communication between other parts of the system. In some examples, a separate control input can be used to manually control the relay function, for example during node servicing or testing. In the context of data centers, this passive solution can minimize disruptive commissioning (e.g., one room Ethernet controller goes offline and disrupts the operation of other Ethernet controllers in other rooms), reduce the amount of investment needed (e.g., no need to buy expensive managed switches), simplifies Ethernet cabling configurations, and is constructable in a small form factor, particularly as an Application-Specific Integrated Circuit (ASIC).

Within a data center, office building, or other physical environment where a series of network devices are located and arranged to communicate with each other, the topology of the network devices may be treated as a series of connected nodes connected in a "daisy chain" fashion as described above. Before one node can communicate with an adjacent node, an Ethernet cable is connected from an Ethernet port of one node to an Ethernet port of its adjacent node. Using a passive by-pass switch according to examples provided herein, the by-pass switch is coupled to a first Ethernet port and a second Ethernet port, an Ethernet cable is connected between the first Ethernet port and a first adjacent node and another Ethernet cable is connected between the second Ethernet port and a second adjacent node. Each Ethernet port includes at least four connections: two connections for transmission of data and two connections for receiving data. The four connections of each Ethernet port are individually coupled to a respective switch, which is in turn coupled to a physical interface. For example, a first connection of an Ethernet port is a connection for data transmission that is switchably connected to a connection of the physical interface for data transmission, the second connection of the Ethernet port is another connection for data transmission that is switchably connected to another connection of the physical interface for data transmission, a third connection of the Ethernet port for receiving data is switchably connected to a connection the physical interface for receiving data, and the fourth connection is another connection for receiving data that is switchably connected to another connection of the physical interface for receiving data. A second physical interface switchably coupled to the second Ethernet port can be arranged in the same manner. Each physical interface may be coupled to a processor of the node. In some examples where the physical interfaces are connected to a processor, the physical interface acts as a switch to couple an Ethernet port to the processor.

Physical interfaces in the context of Ethernet are often referred to as "PHY." The PHY is an integrated circuit that acts as an interface between the internal Ethernet signals and the external Ethernet signals. The PHY normally connects to another integrated circuit that acts as a switch for the communication signals. This switch can be a special integrated circuit or implemented in a microcontroller unit (MCU).

When each node is properly coupled to the other nodes in a network configuration and all nodes receive sufficient power to operate normally, Ethernet traffic passes from one node to the next node. In some examples, different connections are made between the Ethernet ports and their respective physical interfaces because the physical interfaces can determine which connections need to be made and then create such connections in response. Additionally, the physical interfaces may adjust for different polarities (e.g., M to P and P to M). Certain PHY's are capable of detecting which pair is the receiving one and which pair is the transmitting one, which is known as Auto MDI-X.

Figure 1:
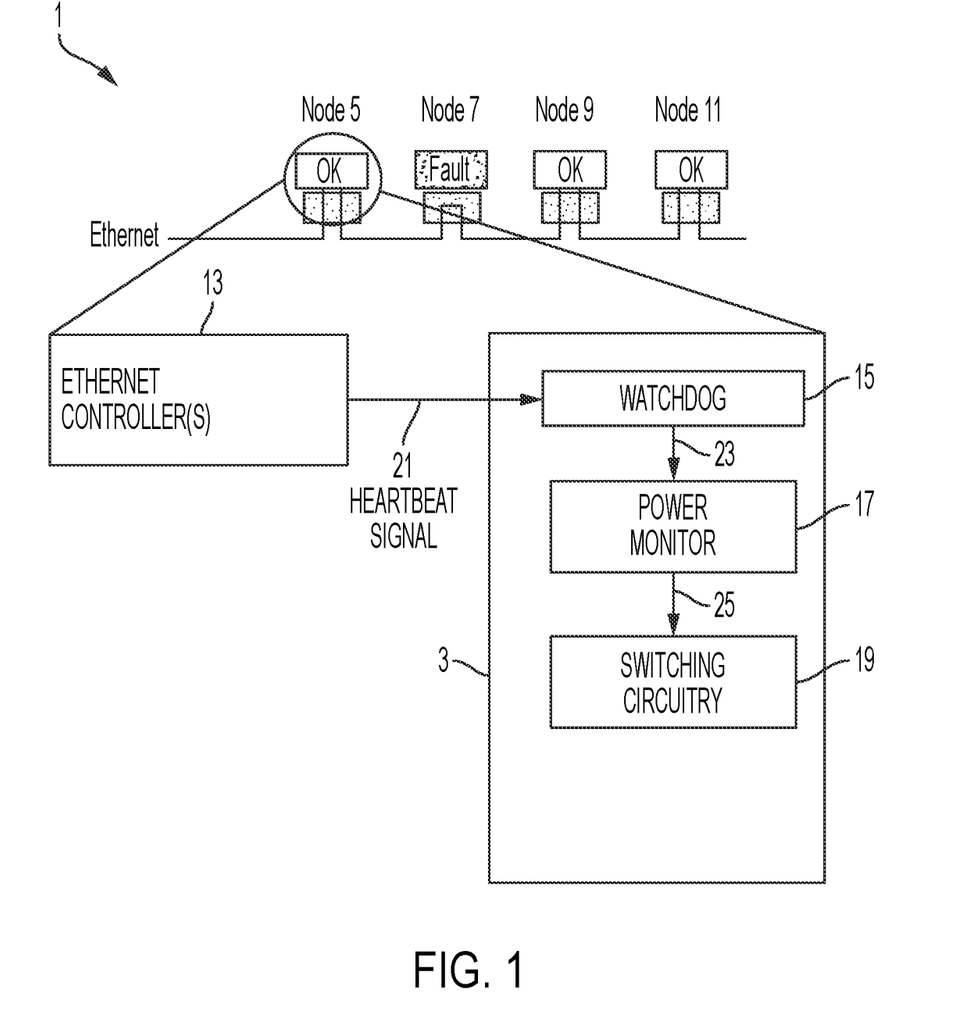
FIG. 1 is a functional block diagram of a system including a passive Ethernet by-pass switch in accordance with aspects described herein.

FIG. 1 illustrates a functional block diagram of a system generally indicated at 1 including a passive Ethernet by-pass switch 3 as described herein. As discussed above, in a network configuration where network nodes are daisy chained together, one of the nodes may fail (e.g., fails to communicate Ethernet data between adjacent nodes). Each node may include one or more Ethernet controllers. The system 1 includes a series of nodes coupled together in a daisy chain fashion, the series including a first node 5 connected to a second node 7, which is connected to a third node 9, which is connected to a fourth node 11. Each of the nodes 5, 7, 9, 11 may include one or more Ethernet controllers 13 and a respective passive Ethernet by-pass switch 3. It is to be appreciated that the number of nodes illustrated is merely an example and real-world implementations of the system 1 may have few nodes or more nodes. It is also to be appreciated that any of the nodes 5, 7, 9, 11 may contain a passive Ethernet by-pass switch according to embodiments described herein. In certain examples, the passive Ethernet by-pass switch 3 is constructed as an Application Specific Integrated Circuit (ASIC) and includes a watchdog circuit 15, a power monitoring circuit 17, and switching circuitry 19. In examples of the passive Ethernet by-pass switch being implemented as an ASIC, the ASIC may include the power monitoring circuit 17 configured to monitor the status of power being provided to the ASIC.

One example of a node failure or fault (e.g., in the second node 7 as shown in FIG. 1) necessitating the bridging of ports adjacent to the failed node is when a processor or controller included in a node has lost power. The controller may be configured to provide a heartbeat signal indicating its operational status. When the passive Ethernet by-pass switch 3 receives the heartbeat signal, it can assume the controller is powered and operating normally. When the heartbeat signal is no longer detected, the passive Ethernet by-pass switch 3 can assume that the controller has lost power and it is necessary to bridge the failed node. For example, as shown in FIG. 1, the Ethernet controller 13 provides a heartbeat signal 21. The watchdog circuit 15 of the Ethernet by-pass switch 3 may receive the heartbeat signal 21 and provide a corresponding signal 23 to the power monitoring circuit 17 to thereby indicate the presence or absence of the heartbeat signal 21. The input signal (i.e., the heartbeat signal 21) provided to the watch dog circuit 15 is a pulse train in certain examples, and the output signal (i.e., the corresponding signal 23) that is output from the watchdog circuit 15 is a signal that is either high or low. In these examples, the watchdog circuit 15 interprets the presence of the pulse train as a logical high, and the absence of a pulse train to a logical low.

The power monitoring circuit 17 is coupled to the watchdog circuit 15 and the switching circuitry 19 of the passive Ethernet by-pass switch 3. The power monitoring circuit 17 provides power to the switching circuitry 19 via a power monitoring signal 25. The by-pass switch 3 is configured to be connected with one or more Ethernet ports. It is understood that the heartbeat signal 21 may be provided by other components, for example a central processing unit (CPU) or any other device that detects whether Ethernet communication has ceased at a given node.

In at least one example, the heartbeat signal is generated by the internal Ethernet switch circuit, embodied by an MCU, that is connected to one or more of the Ethernet controllers. In normal operation, communication data passes through the first Ethernet port, through the second internal switch, through the first Ethernet controller, through the Ethernet switch, and then back through the second/lower Ethernet controller (the lower Ethernet controller shown in FIG. 2A for example, discussed in more detail below), the third internal switch and the second Ethernet port. The internal Ethernet switch may also be embodied by a special switch circuit that is controlled by an MCU. In this case, the heartbeat signal is generated by the MCU that is not used as an Ethernet switch.

The switching circuitry 19 of the passive Ethernet by-pass switch 3, which includes several internal switches and a depletion mode transistor, is configured to either be in a bypass state or a normal/operation state. In the normal state, Ethernet data/traffic passes from one or more Ethernet ports through the by-pass switch while at least one Ethernet controller is coupled to the by-pass switch. The one or more Ethernet controllers 13 convert data from the Ethernet ports into a format understood by a processor and also convert data from the Ethernet ports from the processor's format into a format suitable for transmission over the Internet. In certain examples, the Ethernets controllers are PHY's. In the bypass state, for example when a processor communicating with the Ethernet ports loses power, one Ethernet port is directly connected to the other Ethernet port via the switching circuitry. This direct connection enables the Ethernet ports to still send or receive data between themselves without communication from the failed processor. Therefore, if one port loses power or loses a connection with an Ethernet controller, or the Ethernet controller loses a connection with its switch circuit or processor, the data sent/received by the port can be forwarded to another port.

Figure 2A:
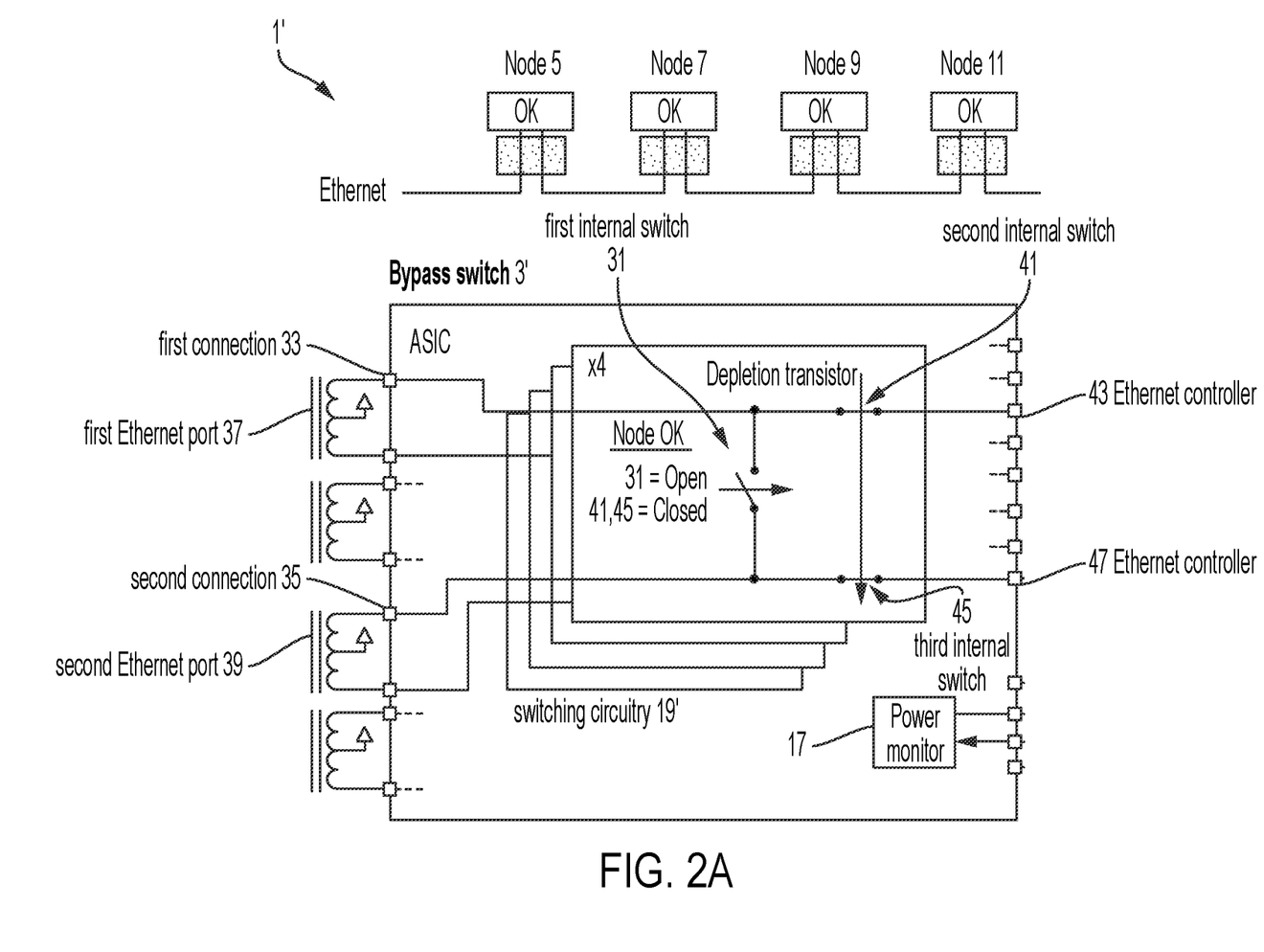
FIG. 2A illustrates switching circuitry of a passive Ethernet by-pass switch in a first state according to aspects described herein.

FIG. 2A illustrates a circuit diagram including a system generally indicated at 1' including a passive Ethernet by-pass switch 3' with switching circuitry 19' including three internal switches in each of four layers. All discussion of the by-pass switch 3 and the switching circuitry 19 (and vice versa) is considered applicable and descriptive of the by-pass switch 3' and the switching circuitry 19' unless otherwise noted. The first internal switch 31 of the three internal switches is connected between a first connection 33 and a second connection 35. As shown in FIG. 2A, the first internal switch 31 includes a depletion mode transistor, the benefits of which are discussed in more detail below. Unless stated otherwise, it is to be assumed that reference to "a depletion mode transistor" of an internal switch or the like includes reference to a pair of depletion mode transistors of the internal switch. The first connection 33 is configured to be coupled to a first Ethernet port 37 and the second connection 35 is configured to be coupled to a second Ethernet port 39. The second internal switch 41 is coupled to the first connection 33 and is configured to be coupled to a first Ethernet controller 43. The third internal switch 45 is coupled to the second connection 35 and is configured to be coupled to a second Ethernet controller 47.

When the node corresponding to the by-pass switch 3' is in the normal state (e.g., the nodes 5, 7, 9, 11 are operating normally), the first switch 31 is open and the second and third switches 41, 45 are closed, thereby connecting the two Ethernet ports 37, 39 through the first and second connections 33, 35 respectively to the Ethernet controllers 43, 47.

Figure 2B:
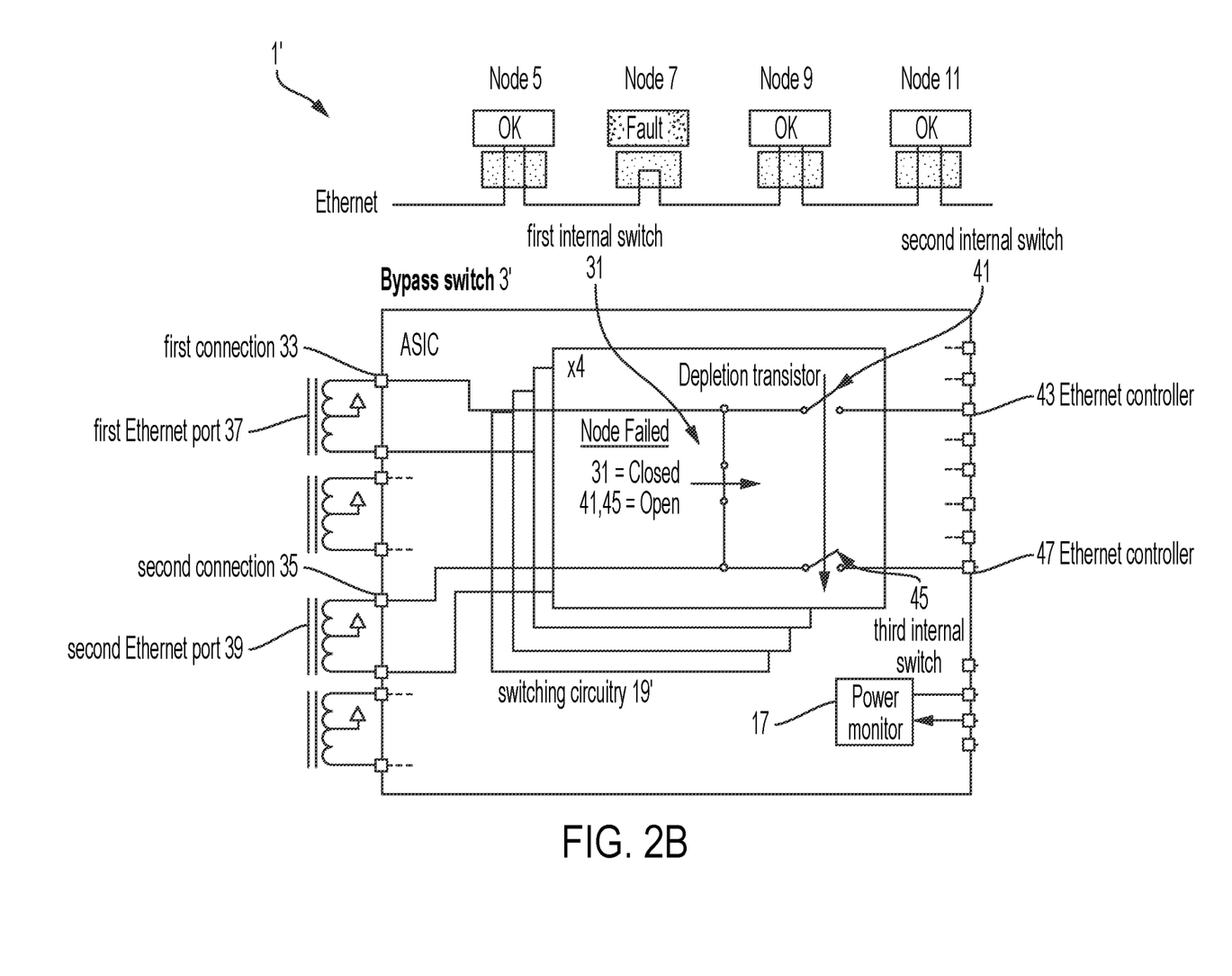
FIG. 2B illustrates switching circuitry of a passive Ethernet by-pass switch in a second state according to aspects described herein.

In one embodiment, the second and third switches 41, 45 operate together such that a control signal operates both switches to close or to open. It is understood that each of the second and third switches 41, 45 could be operated independently. In the normal state, the first switch 31 is open and the second and third switches 41, 45 are closed, as shown in FIG. 2A. In the bypass state, as shown in FIG. 2B, the first switch 31 is closed and the second and third switches 41, 45 of the bypass switch 3 are opened, thereby connecting the two Ethernet ports 37, 39 together via the first switch 31. Although not shown in FIG. 2B, the by-pass switch 3' includes the watchdog circuit 15 coupled to the power monitoring circuit 17. The watchdog circuit 15 is removed to better illustrate the switching circuitry 19'. Other connections or elements may not be shown in FIG. 2A for the same reasons. In FIGS. 2A and 2B, the by-pass switch 3' is located at node 7 for purposes of illustrating differences between the normal and bypass states.

Figure 3:
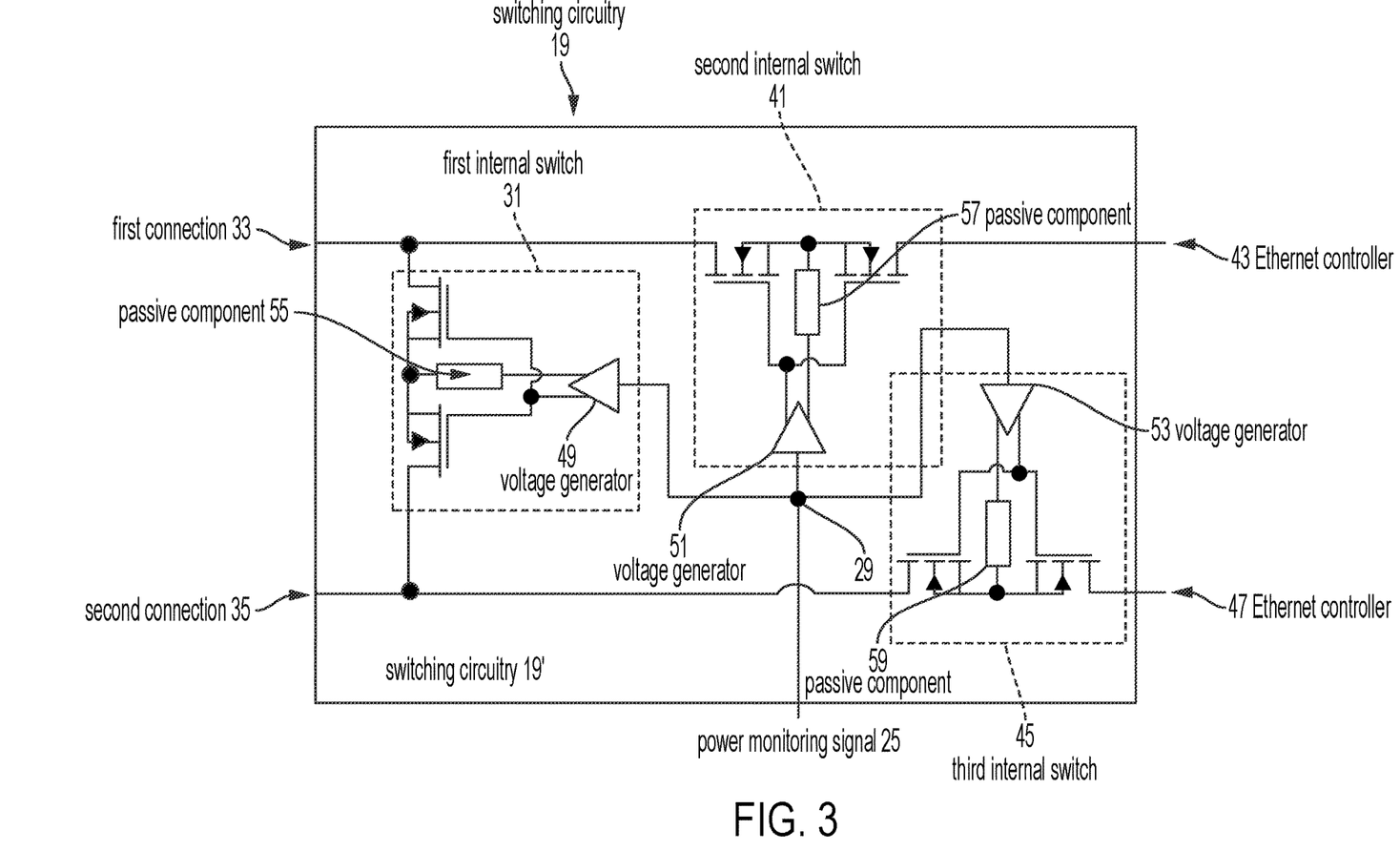
FIG. 3 illustrates switching circuitry including depletion mode transistors according to aspects described herein.

To realize the switching circuitry described above (i.e., the switching circuitry 19, 19'), in some examples, the first switch 31 is implemented using a pair of depletion mode field-effect transistors (FETs) connected in series with a common source and the second and third switches 41, 45 are implemented using enhancement mode transistors, as illustrated in FIG. 3. Enhancement-mode MOSFETS (metal-oxide-semiconductor field-effect transistors) are turned off at zero gate voltage while depletion-mode MOSFETS are turned on at zero gate voltage. Thus, by implementing the first switch 31 with depletion-mode transistors or depletion-mode FETS, the first switch 31 will be open when provided with power and will automatically close when power is not provided to the first switch 31 (i.e., the switch is passive). Thus, by utilizing depletion-mode transistors, the first switch 31 can bypass the failed node without requiring power to close. With zero gate voltage, the gate depletion mode transistors may not be fully "off", but not fully "on" either, and in certain embodiments, the "on" resistance could be lowered even more by applying a voltage to the gate. The power monitoring circuit 17 is coupled to the first internal switch 31, the second internal switch 41, and the third internal switch 45. The power monitoring circuit 17 provides a voltage or other signal to each transistor of the three internal switches 31, 41, 45.

As shown in FIG. 3, the power monitoring signal 25 is provided to a node 29 shared by a voltage generator of each of the three switches. The first internal switch 31 includes a voltage generator 49 coupled to the gates of the two depletion mode transistors of the first internal switch 31 and also coupled to the node 29 that receives the power monitoring signal 25. A passive component 55 is coupled between the voltage generator 49 and the sources of the two depletion mode transistors of the first internal switch 31. The second internal switch 41 includes a voltage generator 51 coupled to the gates of the two enhancement mode transistors of the second internal switch 41 and also coupled to the node 29 that receives the power monitoring signal 25. Similarly, the third internal switch 45 includes a voltage generator 53 coupled to the gates of the two enhancement mode transistors of the third internal switch 45 and also coupled to the node 29 that receives the power monitoring signal 25. A passive component 57 is coupled between the voltage generator 51 and the sources of the two enhancement mode transistors of the second internal switch 41. Similarly, a passive component 59 is coupled between the voltage generator 53 and the sources of the two enhancement mode transistors of the third internal switch 45.

The voltage generator of each internal switch includes three connections. A first connection receives the power monitoring voltage, a second connection is coupled to a passive component, such as a resistor, and the third connection is coupled to the gates of the transistors of the switch. Thus, the same voltage value is applied to the gates of both transistors. In the configuration shown in FIG. 3, the drain of one depletion mode transistor of the first internal switch 31 is coupled to the first connection 33 of the first Ethernet port 37 and the other drain of the other depletion mode transistor is coupled to the second connection 35 of the second Ethernet port 39.

In certain examples, the depletion mode transistor of an internal switch of a passive Ethernet by-pass switch includes a first depletion mode transistor and a second depletion mode transistor. The first depletion mode transistor includes a drain connection and the second depletion mode transistor includes a drain connection. The gate connection of the first depletion mode transistor is controlled by a first voltage source and the gate connection of the second depletion mode transistor is controlled by a second voltage source. The drain connection of the first depletion mode transistor is coupled to the drain connection of the second depletion mode transistor.

In some examples, the power monitoring circuit 17 is not included in the passive by-pass switch and the watchdog circuit 15 communicates directly with the voltage sources that provide control voltages to the gates. In other examples, one or more of the passive components 55, 57, 59 is a resistor and the resistance of the resistor is kept as low as possible. Certain examples do not include the resistor. Other examples omit the passive components 55, 57, 59.

One or more of the voltage generators 49, 51, 53, according to at least one embodiment, is controlled by the power monitoring circuit 17 and the watchdog circuit 15. To obtain a high signal out from the voltage generator, the voltage generator requires a signal from the power monitoring circuit 17 and a signal from the watchdog circuit 15. If any of the signals from the power monitoring circuit 17 or the watchdog circuit 15 is low, all the voltage generators 49, 51, 53 will stop generating voltage, thus turning the first internal switch 31 on and the second and third internal switches 41, 45 off. The internal logic levels may be inverted, meaning that a logic 1 (TRUE) may be represented by a low voltage level instead of a high voltage level, and a logic 0 (FALSE) may be represented by a high voltage level.

Figure 4A:
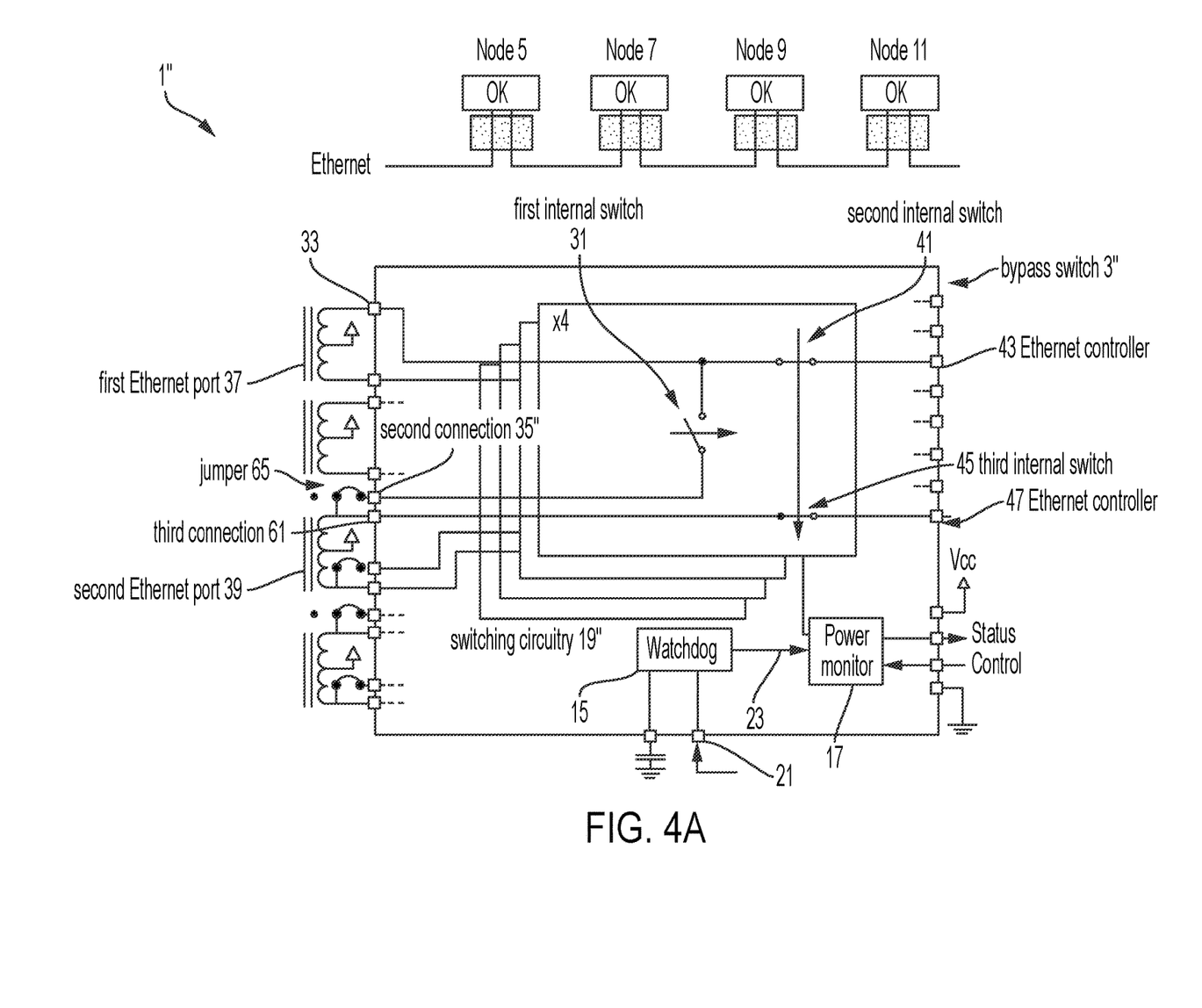
FIG. 4A illustrates switching in a first state and coupled to a jumper according to aspects described herein.

In certain examples of a passive Ethernet by-pass switch, such as the passive by-pass switch 3" including switching circuitry 19" shown in a system generally indicated at 1" in FIG. 4A, the watchdog circuit 15 within the passive by-pass switch 3" receives a heartbeat signal generated by a device that is external to the passive by-pass switch. All of the discussion of the by-pass switch 3" and the switching circuitry 19" is considered applicable and descriptive of the by-pass switch 3 and the switching circuitry 19 (and vice versa) unless otherwise noted. It is to be appreciated that the term "system" encompasses various components of components. For example one system includes the nodes 5, 7, 9, 11, the first and second Ethernet ports 37, 39, and the by-pass switch 3". Another system includes the bypass switch 3" and not the nodes 5, 7, 9, 11. The heartbeat signal may be the heartbeat signal 21 or the heartbeat signal may be generated by a separate device than the one or more Ethernet controllers 13. The heartbeat signal is indicative of the operating status of the external device and the watchdog circuit 15 monitors the heartbeat signal. According to at least one example, the device being monitored is a processor or an Ethernet controller. The heartbeat signal's absence may indicate the processor or Ethernet controller has lost power or has otherwise failed.

The watchdog circuit 15 is coupled to the power monitoring circuit 17 such that the power monitoring circuit 17 receives the signal 23 provided by the watchdog circuit based on an established timing of the heartbeat signal. In an example, the signal 23 provided by the watchdog circuit 15 to the power monitoring circuit 17 is provided each time the heartbeat signal is received by the watchdog circuit 15. In another example, the signal 23 provided by the watchdog circuit to the power monitoring circuit 17 is provided every other time the heartbeat signal is received by the watchdog circuit 15. It is understood that other variations of the timing or periodicity of the signal provided by the watchdog circuit are contemplated herein.

In some examples, a watchdog circuit used in any of the passive by-pass switches described herein is configured to be coupled to external passive components that are used to set the timing of the signal provided by the watchdog circuit to the power monitoring circuit 17. One such configuration of passive components includes one or more resistors and/or capacitors. A benefit to providing the passive components externally is making it easy for a user to swap them for passive components of other values to optimize the timing of the signal provided by the watchdog circuit.

While the watchdog circuit 15 provides the signal 23 to the power monitoring circuit 17 according to the established timing, the power monitoring circuit 17 simultaneously can provide a voltage or other signal to the voltage generators, which in turn provide power to the first internal switch 31, the second internal switch 41, and the third internal switch 45. Thus, in the normal state (e.g., the state of the switching circuitry 19" in FIG. 4A), the first internal switch 31 remains open while the second and third internal switches 41, 45 remain closed, thereby facilitating communication between the Ethernet ports 37, 39 and the Ethernet controller(s) 43, 47. Responsive to the signal 23 not being received by the power monitoring circuit 17 according to the established timing, the power monitoring circuit 17 simultaneously ceases providing power to the internal switches. Responsive to losing power at the gates of the depletion mode transistors of the first internal switch 31, the first internal switch 31 acts as a bridge between the first and second connections 33, 35, thereby forming a path for the first Ethernet port 37 to communicate with the second Ethernet port 39 from the first connection 33 through the depletion mode transistors and then to the second connection 35. In the same manner, the second Ethernet port 39 communicates with the first Ethernet port 37 between the second connection 35 and the first connection 33. At the same time or substantially the same time that the first switch 31 closes responsive to losing power, the second and third internal switches 41, 45 open.

In the normal state, the transistors of the second switch 41 create a communication path between the first Ethernet port 37 and, for example, a first Ethernet controller (e.g., the Ethernet controller 43) as shown in FIG. 2A. Similarly, the transistors of the third switch 45 create a communication path between the second Ethernet port 39 and a second Ethernet controller (e.g., the Ethernet controller 47). Responsive to the power monitoring circuit 17 ceasing to provide power to the voltage regulators 51, 53 of the second and third internal switches 41, 45, the communication path between the transistors of the second switch 41 and the communication path between the transistors of the third switch 45 are opened or severed. Thus, at substantially the same time, when in the bypass state, the first internal switch 31 closes and the second and third internal switches 41, 45 open.

Figure 4B:
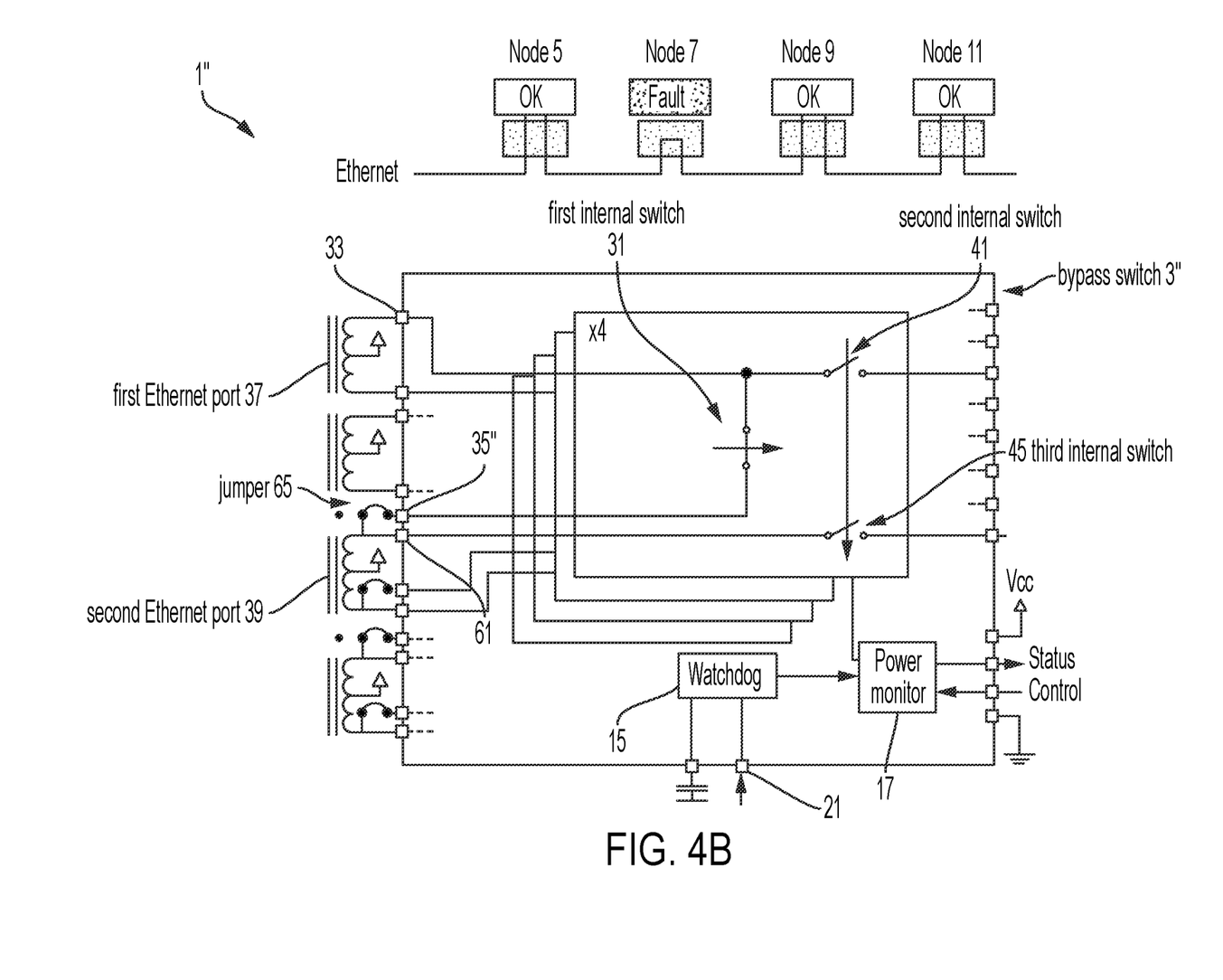
FIG. 4B illustrates switching circuitry in a second state and coupled to a jumper according to aspects described herein.

To provide a user with the ability to manually enable or disable the functionality of the first switch 31 of switching circuitry of a passive Ethernet by-pass switch, embodiments include switching circuitry configured to be connected to the Ethernet ports via jumpers. It is understood that embodiments of passive by-pass switches configured to be connected to an Ethernet port via a jumper include at least all of the benefits of those embodiments that are not configured to be used with jumpers. As shown in FIG. 4A, the switching circuitry 19" includes a third connection 61 coupled to the third switch 45 and the second Ethernet port 39 is connected to the first switch 31 of the switching circuitry 19" via a jumper 65 that bridges the second and third connections 35", 61. The second connection 35" differs from the second connection 35 in that the first switch 31 is coupled to the third switch 45 when the jumper 65 is coupled to the second Ethernet port 39 and the second connection 35", whereas the first switch 31 and the third switch 45 are coupled to the second connection 35 without needing a jumper. When the jumper 65 is connected to the second and third connections 35", 61, the functionality of the first switch 31 is enabled. When the jumper 65 is removed, the functionality of the first switch 31 is disabled, thereby preventing direct communication between the first Ethernet port 37 and the second Ethernet port 39. When the jumper 65 is in place and the passive Ethernet by-pass switch 3" is in the normal state, as shown in FIG. 4A, the first switch 31 is ready to close responsive to losing power. In the bypass state with the jumper 65 in place, as shown in FIG. 4B, data may pass between the first and second Ethernet ports 37, 39. It is understood that the first Ethernet port 37 and switching circuitry 19" may be configured to include an additional jumper similar to the jumper 65 used for the second Ethernet port 39. In FIGS. 4A and 4B, the by-pass switch 3" is located at node 7 for purposes of illustrating differences between the normal and bypass states.

Figure 4C:
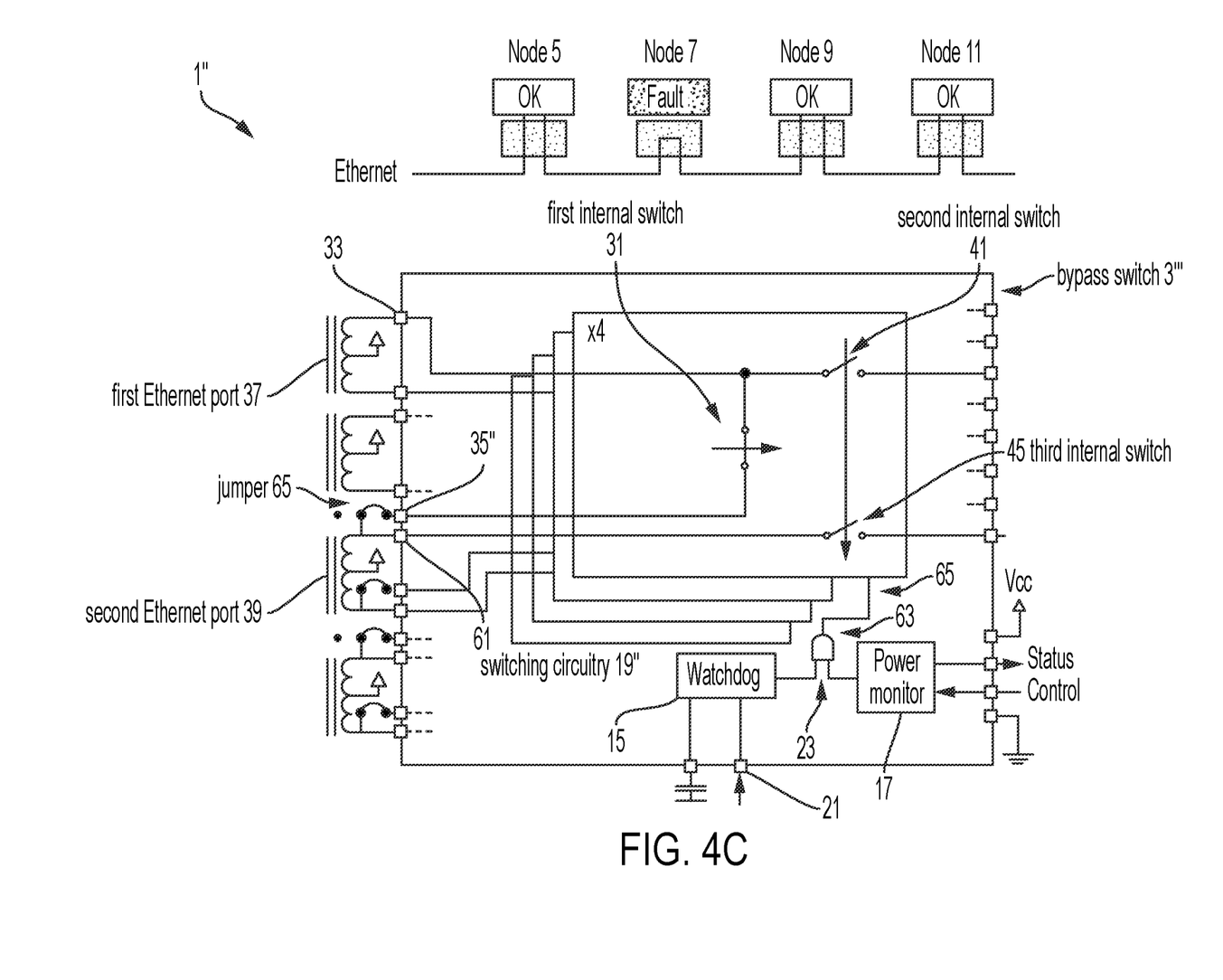
FIG. 4C illustrates switching circuitry in a second state and coupled to a jumper according to aspects described herein.

FIG. 4C illustrates a bypass switch 3''' that is identical to the switch 3" except for the inclusion of an AND gate 63. The AND gate 63 is a logic circuit that has two inputs and one output. A first input of the AND gate 63 receives the signal 23 from the watchdog circuit 15. A second input of the AND gate 63 receives the output of the power monitoring circuit 17. When both the watchdog signal 23 and the power provided by the power monitoring circuit 17 are present, the output of the AND gate 63 provides a control signal 65 to the node 29 of the internal switching circuitry 19". In the absence of the watchdog signal 23, the output of the AND gate 63 causes the signal 65 to cease providing power to the switching circuitry 19". It is to be appreciated that the above discussion of the watchdog circuit 15, the AND gate 63, and the power monitoring circuit 17 is applicable to all other embodiments including the bypass switch 3, 3', and 3". In certain examples, the AND gate 63 is provided in the transistor driver circuit of the bypass switch 3'''.

As discussed above, the input signal to the watch dog circuit 15 may be a pulse train, and the output signal from the watchdog circuit 15 is a signal that is either a logical high or a logical low. A logical low indicating the absence of the pulse train may be utilized by the power monitoring circuit 17 to determine that there is no power and subsequently turn off a depletion mode transistor or may be used directly to instruct the power monitoring circuit 17 turn off the signal provided by the power monitoring circuit 17 to thereby turn off the depletion mode transistor. With the inclusion of the AND gate 63, responsive to the AND gate 63 receiving a logical high from the watchdog circuit 15 and a signal from the power monitoring circuit 17 indicating that power is nominal or present, the depletion mode transistor is turned on or maintained to be on. Responsive to either the AND gate 63 receiving a logical low from the watchdog circuit 15 or a signal from the power monitoring circuit 17 indicating that power is absent or inadequate, the depletion mode transistor is turned off or maintained to be off.

Figure 5:
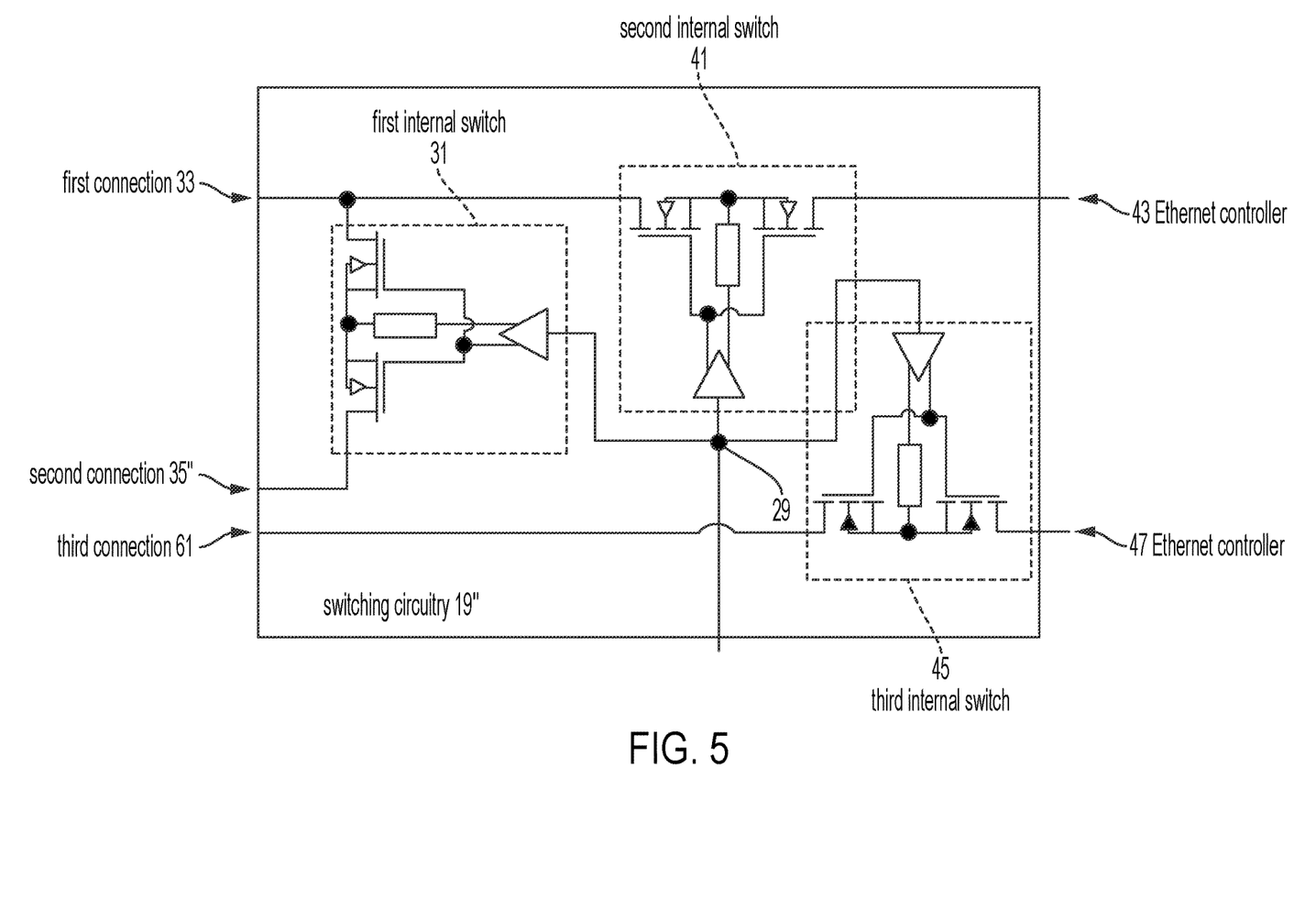
FIG. 5 illustrates switching circuitry including depletion mode transistors according to aspects described herein.

FIG. 5 illustrates switching circuitry 19" that includes the first internal switch 31, the second internal switch 41, and the third internal switch 45 similarly to the switching circuitry 19' shown in FIG. 3. While the internal components (e.g., voltage regulators and transistors) of the internal switches 31, 41, and 45 and the first connection 33 are unchanged from the switching circuitry 19', the switching circuitry 19" includes a second connection 35" and a third connection 61. Unlike the second connection 35 that directly couples the first internal switch 31 to the third internal switch 45 in the switching circuitry 19', the first internal switch 31 and the third internal switch 45 of the switching circuitry 19" are not directly coupled at the second connection 35. To accommodate the jumper 65 for the second Ethernet port 39, the switching circuitry 19 may be configured as the switching circuitry 19" shown in FIG. 5, where the first and third switches 31, 45 are coupled to two separate connections: second connection 35" and third connection 61. When the second connection 35" and the third connection 61 are coupled/bridged together at the second Ethernet port 39 via the jumper 65, the node shared by the second connection 35", the third connection 61, and the jumper 65 is equivalent to the second connection 35.

Figure 6:
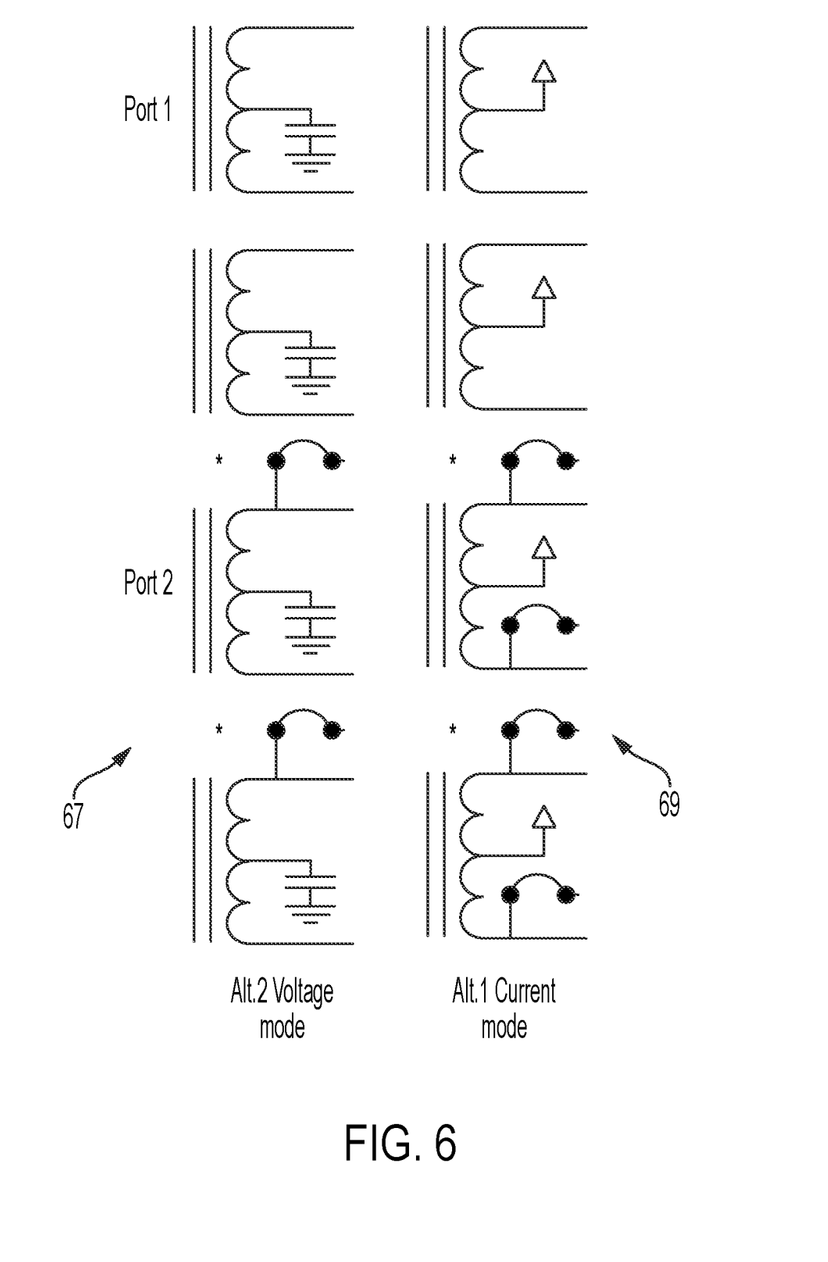
FIG. 6 illustrates different jumper configurations for changing a mode of operation of an Ethernet by-pass switch according to aspects described herein.

Different jumper configurations are provided to change the mode of operation of the passive Ethernet by-pass switch 3". In an example, and as illustrated in FIG. 6, a voltage mode jumper configuration generally indicated at 67 and a current mode jumper configuration generally indicated at 69 are provided to place the Ethernet by-pass switch 3" in either a voltage or current mode of operation.

As described above, improved Ethernet by-pass switches are provided that include passive internal switches utilizing depletion mode transistors. While certain embodiments include depletion mode transistors and enhancement mode transistors, one of ordinary skill in the art would understand variations and modifications to the described embodiments can be made. For example, when implemented as a single ASIC chip, the passive by-pass switch may include a power monitor on the same chip or in other examples, the power monitor is included in a separate chip or device.

Having thus described several aspects of at least one embodiment of this invention in considerable detail with reference to certain preferred version thereof, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:
1. A passive Ethernet by-pass switch comprising:
 a first connection configured to be coupled to a first Ethernet port;
 a second connection configured to be coupled to a second Ethernet port; and switching circuitry including at least one internal switch operable to allow network communication between the first connection, the second connection, and at least one Ethernet controller, the at least one internal switch including a depletion mode transistor operable to bridge the first connection to the second connection to establish communication between the first connection and the second connection;

a watchdog circuit configured to receive a heartbeat signal from the at least one Ethernet controller or a microcontroller coupled to the at least one Ethernet controller and to provide a signal indicative of a presence or an absence of the heartbeat signal; and a power monitoring circuit coupled to the switching circuitry and the watchdog circuit, the power monitoring circuit configured to operate the Ethernet by-pass switch to cease providing power to the depletion mode transistor.

2. The passive Ethernet by-pass switch of claim 1 wherein the passive Ethernet by-pass switch further comprises a third connection configured to be connected to the second Ethernet port.

3. The passive Ethernet by-pass switch of claim 1 wherein the at least one internal switch further includes a second internal switch operable to couple the first connection to the at least one Ethernet controller, and a third internal switch operable to couple the second connection to the at least one Ethernet controller.

4. The passive Ethernet by-pass switch of claim 3 wherein the second internal switch and the third internal switch each include an enhancement mode transistor.

5. The passive Ethernet by-pass switch of claim 1 wherein the passive Ethernet by-pass switch is implemented as a single integrated circuit chip.

6. The passive Ethernet by-pass switch of claim 5 wherein the single integrated circuit chip is an application-specific integrated circuit (ASIC) chip.

7. A passive Ethernet by-pass switch comprising:
a first connection configured to be coupled to a first Ethernet port;
a second connection configured to be coupled to a second Ethernet port;
switching circuitry including at least one internal switch operable to allow network communication between the first connection, the second connection, and at least one Ethernet controller,
the at least one internal switch including a depletion mode transistor operable to bridge the first connection to the second connection to establish communication between the first connection and the second connection; and
a first depletion mode transistor and a second depletion mode transistor,
the first depletion mode transistor including a source connection and a gate connection,
the second depletion mode transistor including a source connection and a gate connection,
the source connection of the first depletion mode transistor coupled to the source connection of the second depletion mode transistor, and
the gate connection of the first depletion mode transistor coupled to the gate connection of the second depletion mode transistor.

8. The passive Ethernet by-pass switch of claim 1 wherein the depletion mode transistor of the at least one internal switch includes:
a first depletion mode transistor and a second depletion mode transistor,
the first depletion mode transistor includes a drain connection, the second depletion mode transistor includes a drain connection,
the gate connection of the first depletion mode transistor is controlled by a first voltage source,
the gate connection of the second depletion mode transistor is controlled by a second voltage source, and
the drain connection of the first depletion mode transistor is coupled to the drain connection of the second depletion mode transistor.

9. The passive Ethernet by-pass switch of claim 1 wherein the watchdog circuit is further configured to provide the signal indicating the presence of the heartbeat signal responsive to receiving the heartbeat signal within a predetermined period of time or within a predetermined number of cycles.

10. The passive Ethernet by-pass switch of claim 1 wherein the at least one internal switch further includes a second internal switch operable to couple the first connection to the at least one Ethernet controller.

11. The passive Ethernet by-pass switch of claim 10 wherein the second internal switch includes an enhancement mode transistor operable to couple the first connection to the at least one Ethernet controller.

12. The passive Ethernet by-pass switch of claim 10 wherein the at least one internal switch further includes a third internal switch operable to couple the second connection to the at least one Ethernet controller.

13. The passive Ethernet by-pass switch of claim 12 wherein the third internal switch includes an enhancement mode transistor operable to couple the second connection to the at least one Ethernet controller.

14. The passive Ethernet by-pass switch of claim 12 wherein the second internal switch and the third internal switch are operable to open responsive to a loss of power.

15. The passive Ethernet by-pass switch of claim 1 wherein the depletion mode transistor is operable to bridge the first connection to the second connection during a loss of power.

16. A system comprising:
a first Ethernet port;
a second Ethernet port;
at least one Ethernet controller;
at least one passive Ethernet by-pass switch comprising a first connection configured to be coupled to the first Ethernet port, a second connection configured to be coupled to the second Ethernet port, and switching circuitry including at least one internal switch operable to allow network communication between the first connection, the second connection, and the at least one Ethernet controller,
the at least one internal switch including a depletion mode transistor operable to bridge the first connection to the second connection establish communication between the first connection and the second connection; and
a first network device, a second network device, and a third network device, the second network device including the at least one passive Ethernet by-pass switch and configured to allow network communication between the first network device and the third network device responsive to the depletion mode transistor bridging the first connection to the second connection to maintain communication between the first connection and the second connection.

17. The system of claim 16 further comprising a jumper configured to connect the second connection to the second Ethernet port.

18. The system of claim 16 wherein the at least one Ethernet controller is configured to generate a heartbeat signal, and the at least one passive Ethernet by-pass switch further comprises:
- a watchdog circuit configured to receive the heartbeat signal from the at least one Ethernet controller or a microcontroller coupled to the at least one Ethernet controller and to provide a signal indicative of a presence or an absence of the heartbeat signal; and
- a power monitoring circuit coupled to the switching circuitry and the watchdog circuit, the power monitoring circuit configured to operate the Ethernet by-pass switch to cease providing power to the depletion mode transistor.

19. The system of claim 18 wherein the at least one Ethernet controller is further configured to generate the heartbeat symbol at least once within a predetermined period of time or at least once within a predetermined number of cycles, and the watchdog circuit is further configured to provide the signal indicating the presence of the heartbeat signal responsive to receiving the heartbeat signal within the predetermined period of time or within the predetermined number of cycles.

20. The system of claim 16 wherein the depletion mode transistor is operable to bridge the first connection to the second connection during a loss of power.

21. A method for bridging a node using a passive Ethernet by-pass switch, the passive Ethernet by-pass switch including a first connection, a second connection, and switching circuitry including at least one internal switch, the at least one internal switch including a depletion mode transistor, the method comprising:
- coupling the first connection to a first Ethernet port;
- coupling the second connection to a second Ethernet port;
- operating the at least one internal switch of the switching circuitry to allow network communication between the first connection, the second connection, and at least one Ethernet controller;
- operating a watchdog circuit to monitor a heartbeat signal from the at least one Ethernet controller;
- providing a signal indicative of the presence or absence of the heartbeat signal to a power monitoring circuit;
- responsive to receiving the signal during a time when the signal indicates the absence of the heartbeat signal, operating the Ethernet by-pass switch to cease providing power to the depletion mode transistor; and
- responsive to operating the Ethernet by-pass switch to cease providing power to the depletion mode transistor, bridging the first connection to the second connection via the depletion mode transistor to establish communication between the first connection and the second connection.

22. A method for bridging a node using a passive Ethernet by-pass switch, the passive Ethernet by-pass switch including a first connection coupled to a first Ethernet port, a second connection coupled to a second Ethernet port, switching circuitry including at least one internal switch operable to allow network communication between the first connection and the second connection, the at least one internal switch including a first depletion mode transistor and a second depletion mode transistor coupled source-to-source to each other, the method comprising:
- providing a voltage to a gate connection of the first depletion mode transistor;
- providing the voltage to a gate connection of the second depletion mode transistor;
- responsive to at least one of the first Ethernet port or the second Ethernet port losing power, ceasing to provide the voltage to the gate connection of the first depletion mode transistor and the second depletion mode transistor; and
- responsive to ceasing to provide the voltage, establishing communicative coupling between the first connection and the second connection.

23. A method for bridging a node to establish network communication between a first network device, via a second network device, to a third network device, the method comprising:
- coupling a first Ethernet port of the second network device to a respective Ethernet port of the first network device;
- coupling a second Ethernet port of the second network device to a respective Ethernet port of the third network device;
- communicatively coupling the first Ethernet port and the second Ethernet port to an Ethernet controller;
- determining that the Ethernet controller has lost power; and
- responsive to determining that the Ethernet controller has lost power, operating an Ethernet by-pass switch situated in the second network device to selectively couple the first Ethernet port to the second Ethernet port via at least one depletion mode transistor.

* * * * *